United States Patent [19]

Maruyama et al.

[11] Patent Number: 4,790,069

[45] Date of Patent: Dec. 13, 1988

[54] METHOD AND APPARATUS FOR MOUNTING ELECTRONIC PARTS

[75] Inventors: Masahiro Maruyama; Eiji Itemadani; Kazuhiro Mori; Mikio Hasegawa, all of Osaka, Japan

[73] Assignee: Matsushita Electric Industrial Co., Ltd., Osaka, Japan

[21] Appl. No.: 862,226

[22] PCT Filed: Aug. 30, 1985

[86] PCT No.: PCT/JP85/00480

§ 371 Date: Apr. 28, 1986

§ 102(e) Date: Apr. 28, 1986

[87] PCT Pub. No.: WO86/01676

PCT Pub. Date: Mar. 13, 1986

[30] Foreign Application Priority Data

Sep. 6, 1984 [JP] Japan ............................ 59-186770

[51] Int. Cl.⁴ ............................ H05K 13/04

[52] U.S. Cl. ............................ 29/832; 29/709; 29/714

[58] Field of Search ............................ 29/832, 834, 705, 709, 29/714, 740

[56] References Cited

U.S. PATENT DOCUMENTS

| | | | |
|---|---|---|---|
| 3,670,388 | 6/1972 | Jack | 29/705 X |
| 4,510,683 | 4/1985 | Fedde et al. | 29/709 X |

*Primary Examiner*—Howard N. Goldberg
*Assistant Examiner*—Taylor J. Ross
*Attorney, Agent, or Firm*—Lowe, Price, LeBlanc, Becker & Shur

[57] ABSTRACT

The present invention relates to a method and apparatus for mounting an electronic part (11) on a circuit board (28). When the part is mounted, a distance between the under surface of a part maintaining section (12) and the circuit board (38) is measured. Determination that the electronic part (11) is normally mounted on the circuit board (28) is made by comparing the measured distance with the thickness of the electronic part (11) measured in advance.

12 Claims, 7 Drawing Sheets

12
11
h3
h2
h1
28

12
11
28

12
28

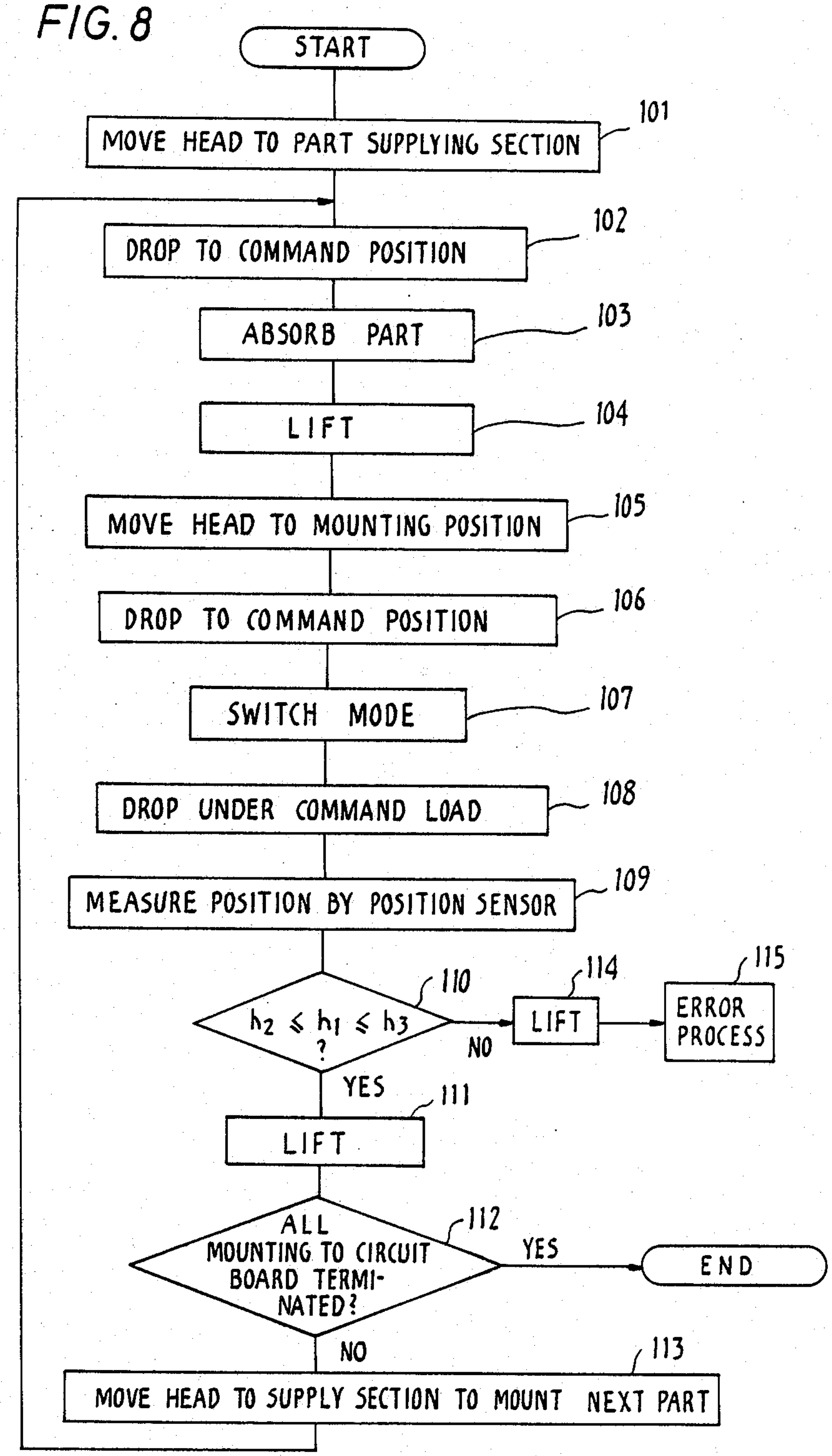
FIG. 8
START
MOVE HEAD TO PART SUPPLYING SECTION
101
DROP TO COMMAND POSITION
102
ABSORB PART
103
LIFT
104
MOVE HEAD TO MOUNTING POSITION
105
DROP TO COMMAND POSITION
106
SWITCH MODE
107
DROP UNDER COMMAND LOAD
108
MEASURE POSITION BY POSITION SENSOR
109
$h_2 \leqq h_1 \leqq h_3$ ?
110
NO
LIFT
114
ERROR PROCESS
115
YES
LIFT
111
ALL MOUNTING TO CIRCUIT BOARD TERMINATED?
112
YES
END
NO
MOVE HEAD TO SUPPLY SECTION TO MOUNT NEXT PART
113

METHOD AND APPARATUS FOR MOUNTING ELECTRONIC PARTS

FIELD OF THE INVENTION

The present invention relates to a method and apparatus for mounting electronic parts, particularly electronic parts formed into a chip-like shape (which will be hereinafter referred to as chip part), on a circuit substrate such as printed circuit board.

DESCRIPTION OF THE PRIOR ART

In conventional electronic part mountings, vacuum absorption is generally employed as shown in FIG. 1 wherein a chip part 1 is attracted through a nozzle 2. FIG. 1 (*a*) to FIG. 1(d) are illustrations of the conditions of vacuum absorption of the chip part 1. FIG. 1(*a*) through FIG. 1(*d*) respectively illustrate the condition that the chip part 1 has normally been absorbed by the nozzle 2, the condition that it has lengthwise been drawn thereby, the condition that it has obliquely been absorbed thereby, and the condition that it has not been attracted. Of these, FIG. 1(*b*) to FIG. 1(*d*) show error of the absorption of the chip part 1, and therefore detection should be made to determine these conditions.

FIG. 2 is an illustration of a conventional vacuum system for the detection of absorption error of a chip part. In the figure, the reference numerals 3 and 4 represent a filter, numeral 5 designating a throttle valve, numeral 6 depicting a magnet, numerals 7 and 8 being a proximity switch, and numeral representing a vacuum source. This system is based on a method in which the absorption error is detected on view of differential pressure. In response to the normal absorption of the chip part 1 to the nozzle 2, the pressure of the nozzle side of a differential measuring device 10 is further decreased. As a result, the magnet 6 is moved in the direction of an arrow to thereby turn on the proximity switch 8. On the other hand, in the case of the occurrence of absorption error thereof as shown in FIGS. 1(*b*) to 1(*d*), the magnet 6 causes no movement because air is introduced from an absorbing opening of the nozzle 2, resulting in turning on another proximity switch 7.

However, one of problems with such a method is that fine adjustment of the throttle valve 5 is required in conformity with the introduction amount varied in accordance with the absorbing condition of the chip part 1, taking a long time for system maintenance.

Various detection methods of the type other than the vacuum differential pressure type of FIG. 2 are known. However, any of them relate to a technique in which the detection is made on the basis of the degree of vacuum, i.e., on the basis of air leak caused by the absorption error of a chip part. Therefore, difficulty is encountered to set a detection reference and further there arises an disadvantage in system maintenance that the detection reference is varied due to the absorption of dust and the like.

DISCLOSURE OF THE INVENTION

A primary object of the invention is therefore to provide a method for mounting electronic parts which is capable of increasing reliability in terms of the detection of a chip part and simplifying system maintenance.

Another object of the invention is to provide an apparatus for realization of the method of the invention.

The above-mentioned object is accomplished by a technique wherein a distance between the under surface of a part maintaining device for maintaining an electronic part and a circuit substrate is measured when the electronic part is mounted on the circuit substrate and then a comparison is made between the measured distance and the thickness of the electronic part measured in advance. The determination that the electronic part has normally mounted thereon is made in accordance with the result of the comparison.

An electronic part mounting apparatus of the invention comprises a sliding shaft having a part maintaining device at an end thereof, a motor for moving the sliding shaft upwardly and downwardly, a drive unit for moving the sliding shaft within a horizontal plane, distance measuring means for measuring a distance between a circuit substrate and the under surface of the part maintaining device when an electronic part is mounted on the circuit substrate, and determining means for determining a normal mounting of the electronic part by comparing the measured distance with the thickness of the electronic part measured in advance.

BRIEF DESCRIPTION OF THE DRAWINGS

FIG. 8 is a flow chart showing a mounting operation of the embodiment.

THE MOST PREFERRED EMBODIMENT OF THE INVENTION

Hereinbelow, embodiments of the present invention will be described with reference to the drawings. A first embodiment of the invention will be described with reference to FIGS. 3 to 5.

Figure 1A:
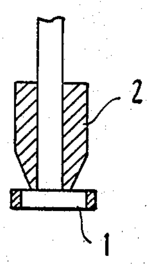
FIGS. 1(*a*) to 1(*d*) are illustrations for describing the conditions that a chip part is absorbed by a nozzle.
Figure 1B:
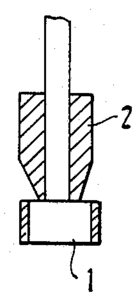
Figure 1C:
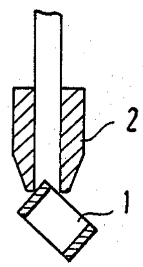
Figure 1D:
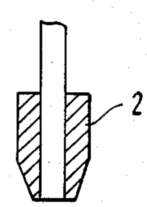
Figure 2:
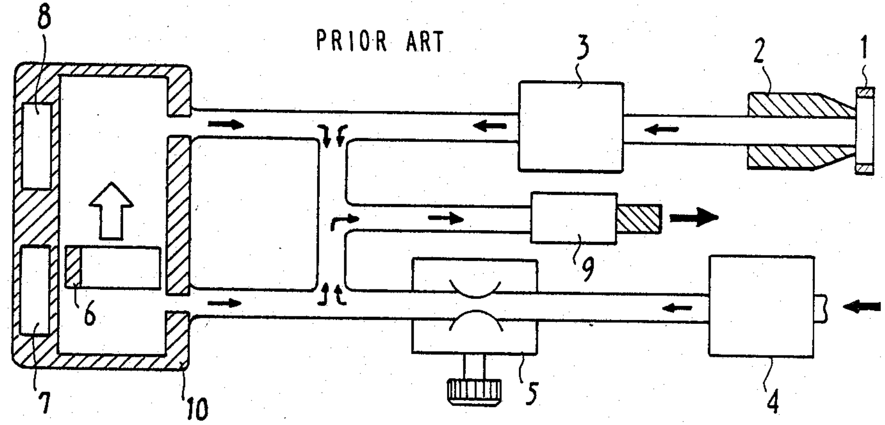
FIG. 2 is a diagram showing a vacuum system based on a conventional chip part detection method.
Figure 3:
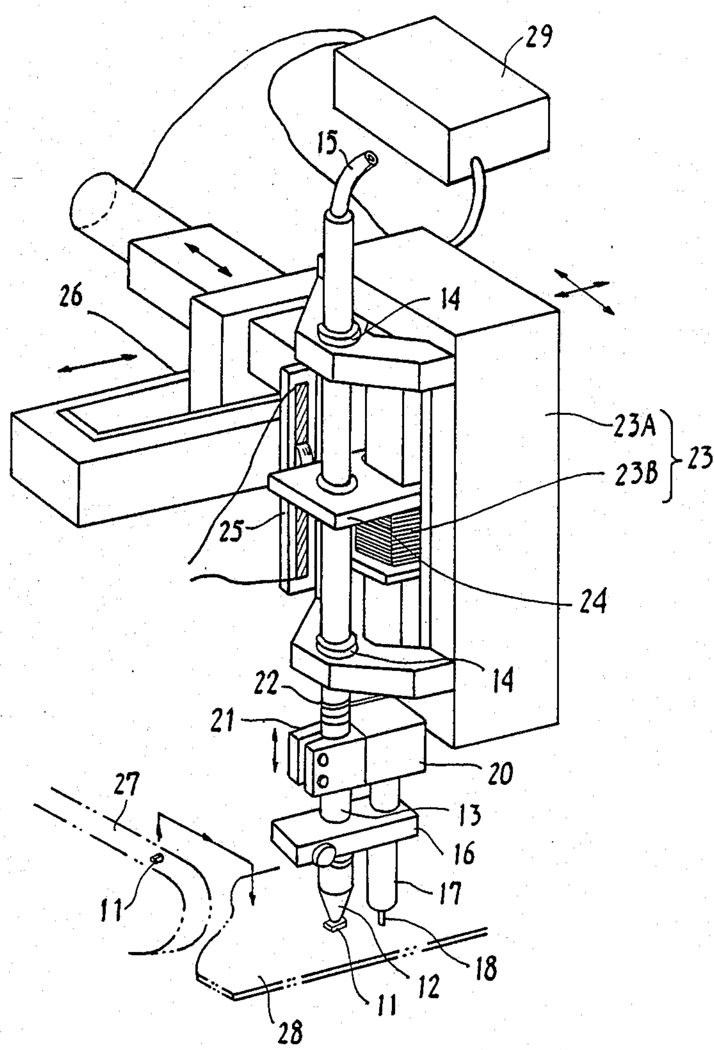
FIG. 3 is a perspective view illustrating an electronic part mounting apparatus according to a first embodiment of the present invention.
Figure 4:
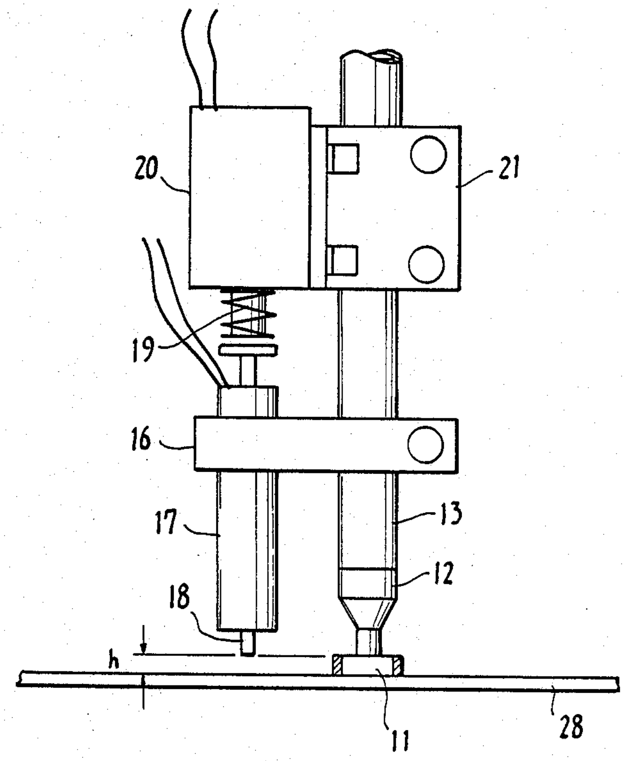
FIG. 4 is a side view showing a main portion of a mounting section of the first embodiment.

In FIGS. 3 and 4, the reference numeral 11 represents a chip part, numeral 12 designating a nozzle for absorbing the chip part 11, numeral 13 depicting a hollow sliding shaft having the nozzle 12 at an end thereof which is guided by means of sliding bearings 14 to be slidable upwardly and downwardly, and numeral 15 representing a tube connecting between the sliding shaft 13 and a vacuum source.

A differential transformer 17 is fixedly secured to the sliding shaft 13 by means of a bracket 16. A needle 18 of the differential transformer 17 is secured through a compression spring 19 to a solenoid 20 which is in turn secured to the sliding shaft 13 by means of a bracket 21. The above-described absorbing section is allowed to run away upwardly by several millimeters.

Designated at numeral 23 is a linear motor comprising a body 23A and a bobbin 23B having a wound wire. An application of a control signal to the bobbin 23B causes upward and downward movement of the sliding shaft 13 through a plate 24 mounted on the bobbin 23B. Numeral 25 represents a detector for detecting a position of the bobbin 23B in terms of height. The linear motor body 23A is fixedly secured at an end of a X-Y drive unit 26 and is selectively located in a X-Y position.

Numeral 27 designates a part supplying section for supplying a chip part and numeral 28 depicts a circuit board on which the chip part is mounted. Designated at 29 is a control unit including a microprocessor and a memory. The control unit 29 is arranged to position the linear motor body 23A on X and Y axes, control upward and downward movement of the sliding shaft 13, and perform ON-OFF control of part absorption.

The operation of the mounting apparatus thus arranged will be described hereinbelow.

First, The X-Y drive unit 26 is driven such that the nozzle 12 is positioned above the part supplying section 27, and in response to the drive of the linear motor 23 the nozzle 12 is fallen and lifted after absorption of the chip part 11. The X-Y drive unit 26 is further driven so that the nozzle 12, having the chip part 11, is located at a mounting position above the circuit substrate 28. Thereafter, the nozzle 12 is fallen in order to mount the chip part 11 on the circuit substrate 28. On mounting the chip part 11, current to the solenoid 20 is turned off whereby the needle 18 is dropped under the action of the compression spring 19. The differential transformer 17 is a well-known displacement sensor and is arranged such that its output voltage is varied in accordance with the displacement amount of the needle 18. Therefore, it is possible to measure a distance between the under surface of the nozzle 12 and the circuit substrate 28, i.e., a height h at the time of the mounting of the chip part 11, on the basis of the variation between the voltage before the falling of the needle 18 and the voltage after the falling thereof. After the termination of the measurement, the needle 18 is lifted in response to application of current to the solenoid 20, and the nozzle 12 is also lifted and transferred by means of the X-Y drive unit 26 to the position of a part to be subsequently mounted. The above-described operation is cyclically repeated, wherein the mounting height h is subsequently measured while mounting.

Figure 5A:
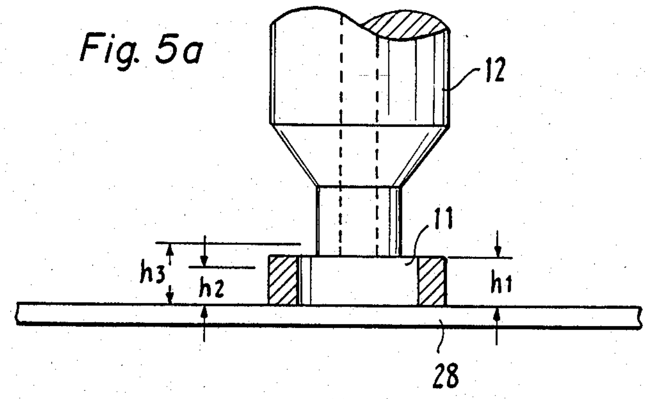
FIGS. 5(*a*) to 5(*c*) are expanded views showing the conditions that a chip part is mounted.
Figure 5B:
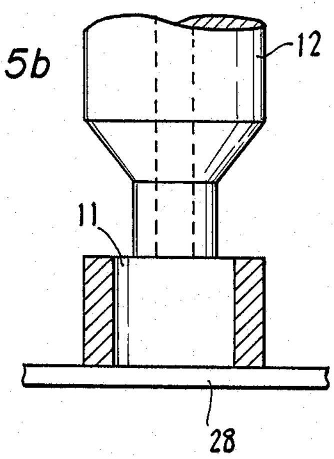
Figure 5C:
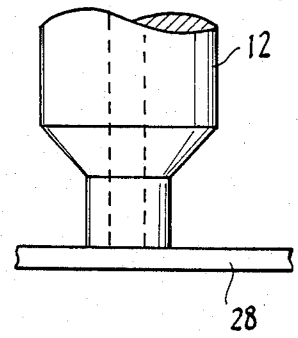

FIGS. 5(*a*) to 5(*c*) are diagrams showing the conditions when the chip part 11 is mounted on the circuit board 28 by the nozzle 12. Of these, FIG. 5(*a*) illustrates the condition that the chip part 11 is normally mounted, FIG. 5(*b*) shows the condition that it is lengthwise mounted, and FIG. 5(*c*) shows the condition that it is not mounted because of absorption error. Assuming that the distance between the under surface of the nozzle 12 and the circuit board 23 is h1, and upper and lower limits taking into account the thickness of the chip part and the dispersion in terms of the thickness of the chip part are respectively h3 and h2, when the chip part is normally mounted, the relation between them is $h3 \geqq h1 \geqq h2$. Therefore, the cases other than the relation result in the mounting error of the chip part shown in FIGS. 5(*b*) and 5(*c*).

Secondly, the second embodiment of the present invention will be described with reference to FIGS. 6 to 8.

Figure 6:
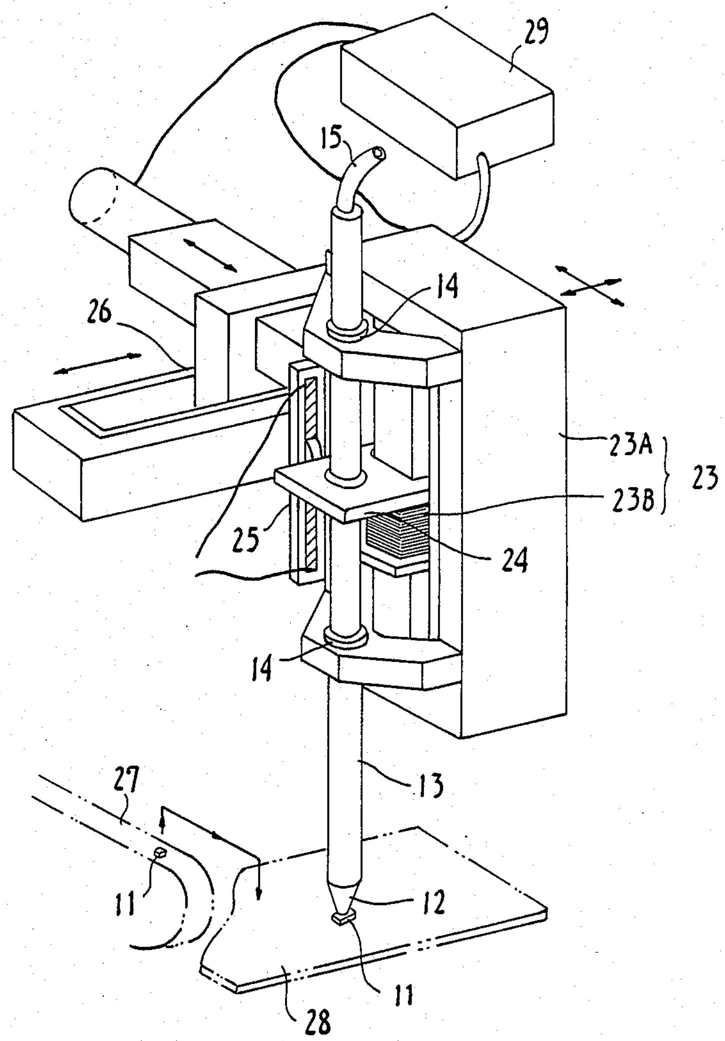
FIG. 6 is a perspective view showing a second embodiment of the present invention.

The embodiment of FIG. 6 is similar to FIG. 3 embodiment with the exception that it does not include the compression spring 22 on the sliding shaft 13 not to have the structure capable of setting free the sliding shaft 13 upwardly and further it does not include the detector for measuring a distance between the under surface of the nozzle 12 and the circuit board 28.

Figure 7:
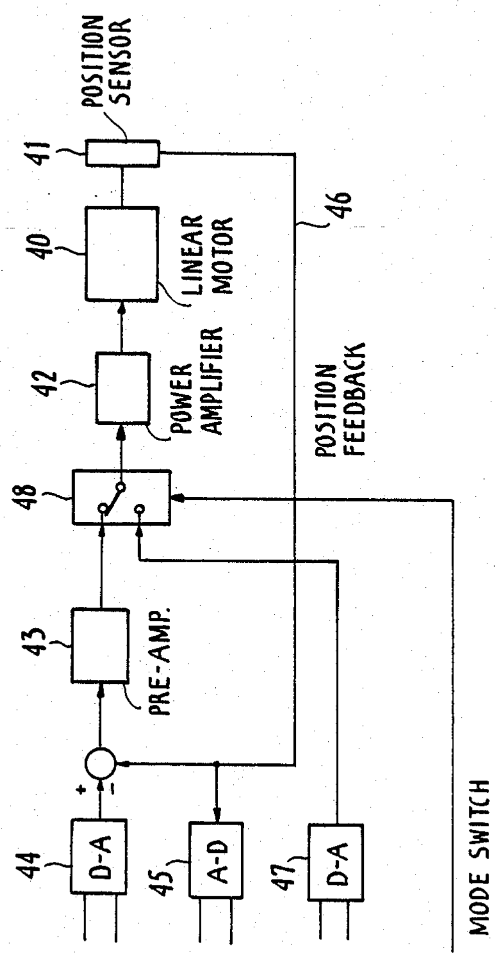
FIG. 7 is a block diagram illustrating a linear motor control section of the embodiment.

FIG. 7 is a block diagram illustrating a section of the control unit 29 for controlling the linear motor 23 of FIG. 6. The reference numeral 40 represents a linear motor corresponding to the linear motor body 23A and the bobbin 23B of FIG. 6. Designated at numeral 41 is a position sensor for detecting the position of the bobbin 23B which corresponds to a device indicated by numeral 25 in FIG. 6. Numeral 42 depicts a power amplifier for driving the linear motor 40, numeral 43 representing a preamplifier, numeral 44 designates a D/A converter for converting a position command (digital signal) from the control unit into an analog signal. Furthermore, numeral 45 represents an A/D converter for converting a position feedback signal (analog signal) 46 for measurement of position into a digital signal, numeral 47 representing a D/A converter for converting a load command (digital signal) from the control unit into an analog signal, and numeral 48 designating a mode changing switch for selecting either of the position control or load control of the linear motor 40.

FIG. 8 is a flow chart for the operation of mounting of the chip part. Hereinbelow, the operation will be described with reference to the figure.

Initially, in a step 101, the nozzle 12 is moved to the part position above the part supplying section 27 by means of the X-Y drive unit 26. Subsequently, a step 102 is executed to fall the nozzle 12, followed by a step 103 in which the chip part 11 is absorbed thereby and a step 104 in which the nozzle 12 is lifted with the absorbed chip part 11. The nozzle 12, in a step 105, is moved to the mounting position above the circuit board 28, followed by a step 106 in which the nozzle 12 is dropped up to the position that is separated by 0.5 to 1 mm from the mounting position of the chip part 11. A subsequent step 107 is executed to switch the mode changing switch 48 to the load control mode, followed by a step 108 wherein the nozzle 12 is fallen in accordance with command load. In a step 109, the position feedback signal 46 from the position sensor 41 is A-D converted by the A/D converter 45 and measured is a dropping amount of the nozzle 12 secured through the sliding shaft 13 and the plate 24 to the bobbin 23B. Assuming that the dropping amount of the nozzle 12 is Hd and the distance between the lifted position of the nozzle 12 and the circuit board 28 is He, the height h1 of the mounted part is expressed by $h1=(He-Hd)$. He is known in advance, and therefore, if the dropping amount Hd of the bobbin 23B is measured in the step 109, it is possible to calculate the part height h1.

A step 110 is provided for comparing h1 with h2 and h3 indicated in FIG. 5(*a*), and in accordance with the result of the comparison either of step 111 or 114 is executed. If the determination is made as an abnormal mounting of the part, the step 114 is executed to lift the nozzle 12, followed by a step 115 in which an error process is performed. On the other hand, if normal, the step 111 is executed such that the nozzle 12 is lifted. The step 111 is followed by a step 112 which is provided for checking whether the mounting to the circuit board is perfectly terminated. The termination causes the end of this operation, while no termination results in executing a step 113 wherein the nozzle 12 is moved to the position of the part which will be subsequently mounted. Thereafter, the operational flow returns to the step 102.

This embodiment, as compared with the first embodiment, is arranged such that the height h1 on the mounting of the chip part 11 is calculated on the basis o the output of the position sensor 25 necessary for the upward and downward drive control of the bobbin 23B by the linear motor 23.

As described above, because the part height h1 is calculated by measuring the dropping amount of the nozzle 12 on part mounting on the basis of the feedback signal 46 from the position sensor 41 for the upward and downward drive source of the chip part maintaining section which feedback signal 46 is A-D converted into a digital signal by means of the A/D converter 45, it is possible to detect the height on the chip part mounting without providing a detector for detecting the part height at a moving portion, resulting in reduction in cost.

In place of the differential transformer 17 used in the first embodiment, an optical length measuring device can be used. It is appropriate to use any device which is capable of measuring the distance between the under surface of the nozzle 12 and the circuit board 28.

Furthermore, in the second embodiment, an analog output sensor has been used, however, it is possible to use a digital output sensor of optical type or magnetic type. In this case, there is no need for using the A/D converter 45.

Industrial applicability

As described above, according to the present invention, the height of a chip part is detected when the chip part is mounted and the part mounting is directly confirmed by comparing the detection value with the range of dispersion in terms of the thickness of the chip part. Therefore, it is possible to increase the reliability of the mounting detection and to simplify the system maintenance, resulting in large practical effect.

What is claimed is:

1. A method for mounting an electronic part on a circuit board, comprising the steps of:

measuring a distance between (a) the under surface of a part maintaining section for maintaining said electronic part and (b) said circuit board by a distance measuring means attached to said part maintaining section; and determining a normal mounting of said electronic part by comparing the measured distance with a thickness of said electronic part measured in advance.

2. A method as claimed in claim 1 wherein said measuring step is accomplished when said electronic part is mounted on said circuit board.

3. An apparatus for mounting an electronic part on a circuit board, comprising:

a sliding shaft having a part maintaining section at an end thereof;

a motor for moving said sliding shaft upwardly and downwardly;

a driver unit for moving said sliding shaft within a horizontal plane;

distance measuring means for measuring a distance between said circuit board and the under surface of said part maintaining section when said electronic part is mounted on said circuit board, said distance measuring means comprising a differential transformer attached to said sliding shaft and having a needle movable upwardly and downwardly and a solenoid for maintaining said needle at an upper portion; and determining means for determining a normal mounting of said electronic part by comparing the measured distance with a thickness of said electronic part measured in advance.

4. An apparatus as claimed in claim 3, wherein said part maintaining section comprises a nozzle for absorbing said electronic part by vacuum absorption at an end thereof.

5. An apparatus for mounting an electronic part on a circuit board, comprising:

a sliding shaft having a part maintaining section at an end thereof;

a motor for moving said sliding shaft upwardly and downwardly, said motor comprising a position sensor for outputting a position signal for controlling said motor;

a drive unit for moving said sliding shaft within a horizontal plane;

distance measuring means for measuring a distance between said circuit board and the under surface of said part maintaining section by calculating a dropping amount of said part maintaining section on the basis of said position signal of said position sensor when said electronic part is mounted on said circuit board; and determining means for determining a normal mounting of said part by comparing the measured distance with a thickness of said electronic part measured in advance.

6. An apparatus as claimed in claim 5, wherein said part maintaining section comprises a nozzle for absorbing said electronic part by vacuum absorption at an end thereof.

7. An apparatus as claimed in claim 6, wherein said position sensor comprises a detector for detecting a position of a movable bobbin of said motor.

8. An apparatus as claimed in claim 5, wherein said position sensor comprises a detector for detecting a position of a movable bobbin of said motor.

9. An apparatus as claimed 5, wherein said motor comprises a linear electric motor.

10. An apparatus as claimed in claim 9, wherein said position sensor comprises a detector for detecting a position of a movable bobbin of said motor.

11. An apparatus as claimed in claim 9, wherein said part maintaining section comprises a nozzled for absorbing said electronic part by vacuum absorption at an end thereof.

12. An apparatus as claimed in claim 11, wherein said position sensor comprises a detector for detecting a position of a movable bobbin of said motor.

* * * * *